United States Patent [19]
French et al.

[11] Patent Number: 6,012,624
[45] Date of Patent: Jan. 11, 2000

[54] SOLDER APPARATUS AND METHOD

[75] Inventors: William French, Glasgow; Stuart Lees, Inverclyde; Colin David McCall, Renfrewshire; Kenneth Skene Murray; Brian Robertson, both of Inverclyde, all of United Kingdom

[73] Assignee: International Business Machines Corporation

[21] Appl. No.: 09/017,742

[22] Filed: Feb. 3, 1998

Related U.S. Application Data

[62] Division of application No. 08/782,022, Jan. 7, 1997, Pat. No. 5,758,815.

[30] Foreign Application Priority Data

Jun. 5, 1994 [GB] United Kingdom .................. 9409000

[51] Int. Cl.$^7$ .................................................. A01K 63/00
[52] U.S. Cl. .................. 228/119; 228/119; 228/180.1; 228/223; 228/234.1; 228/207
[58] Field of Search ............................... 228/119, 180.1, 228/223, 234.1, 207

[56] References Cited

U.S. PATENT DOCUMENTS

| | | |
|---|---|---|
| 4,561,584 | 12/1985 | Hug ........................................... 228/19 |
| 4,847,465 | 7/1989 | Toyama et al. . |
| 5,222,655 | 6/1993 | Moretti et al. ........................... 228/230 |
| 5,878,941 | 3/1999 | Backer et al. ...................... 228/180.21 |

FOREIGN PATENT DOCUMENTS

| | | |
|---|---|---|
| 3427431 | 2/1986 | Germany . |
| 3829596 | 3/1990 | Germany . |
| 124073 | 6/1987 | Japan . |
| 5237650 | 9/1993 | Japan . |
| 2181378 | 4/1987 | United Kingdom . |

*Primary Examiner*—Samuel M. Heinrich
*Attorney, Agent, or Firm*—Lawrence R. Fraley

[57] ABSTRACT

A tool for soldering pin-in-hole electronic circuit components includes a tool plate with a set of via holes corresponding to the holes of a circuit board on which a circuit component is soldered. The board is aligned with the tool plate and hot gas is supplied through the set of plate vias to reflow solder in the board holes. The tool is particularly suitable for use in removing and replacing pinned circuit components. Use of particular gases (e.g., nitrogen) allows soldering to be carried out without the use of flux. Advantages of the tool are that it prevents burning the circuit board and/or unintentionally reflowing other circuit components mounted on the board (by directing hot gas only substantially onto the circuit board's solder-containing holes).

2 Claims, 2 Drawing Sheets

SOLDER APPARATUS AND METHOD

This application is a division of application Ser. No. 8/782,022 filed Jan. 7, 1997 now U.S. Pat. No. 5,758,815.

TECHNICAL FIELD

The present invention relates to an apparatus and method for soldering electronic components to circuit boards. More specifically the present invention relates to an apparatus and method which enables a pin-in-hole electronic component to be removed and replaced on a printed circuit board either with or without using flux.

BACKGROUND OF THE INVENTION

Many different methods and corresponding apparatus are known for mounting and for removing and replacing electronic components on printed circuit boards. A known reflow soldering system In the pin-in-hole technology area uses a stencil to deposit solder alloy paste containing a flux at attachment points at the holes in a printed circuit board. The water soluble or rosin flux is applied only to the solder side of the circuit card. The components are then placed in the holes at the solder paste deposits and heat and/or pressure is then applied to reflow the solder paste. Alternatively the solder is melted from underneath the board through the holes after application of flux, using a solder wave fountain. The flux residues are then removed from the assembled circuit board using a suitable solvent. The purpose of the flux material is to enable the solder to wet the connecting metallic surfaces of the printed circuit board and the electronic component. It also promotes heat flow between the component and circuit connection points and discourages air gaps which could result in a defective solder joint. This method is commonly used when first connecting components to printed circuit boards but is not practical for replacing single damaged or defective components from a populated printed circuit board.

Disadvantages of this type of soldering is that the flux based soldering paste results in unwanted resultant contaminants and other chemicals which can cause electrical shorting and other product failures. The build up of flux residue means that costly and time consuming cleaning operations are necessary. Many of these cleaning operations have proven to be environmentally unsound. Attempts to use the mini solder wave process with low solids no clean flux have resulted in a mass of solder tags and solder webbing. This is a particular problem when a component is being removed by melting the solder with a mini solder wave fountain. As the electronics industry is moving inexorably to a total no clean process, a solution to such repair processes is essential.

Another known method for removing electronic components includes directing a hot jet of gas (e.g., nitrogen) through a nozzle to the solder joints of the electronic component. A problem with this type of system is that the gas needs to be directed in a concentrated area to prevent heating up adjacent components and possible damage to the circuit board. Either multiple nozzles must be employed or the solitary nozzle repositioned for each solder joint to be reflowed. This method is also unsuitable for use with larger electronic components which have a high number of leads. It is difficult to reflow all the solder joints at the same time without damaging the component.

A known method which attempted to overcome the problems solved by using flux involved carrying out the reflow process within a large oven containing nitrogen gas to try and prevent the formation of metal oxides during reflow soldering. One problem with this approach was that the oven proved expensive to operate and the oxides were not entirely eliminated.

In U.S. Pat. No. 4,847,465 (Toyama et al.), there is shown a reflow soldering apparatus for reflowing solder to secure leaded (pinned) and other parts on a circuit board. This apparatus requires relatively complex heat pipe members which, as shown, project externally of the gas chamber housing. This adds cost as well as increases the opportunity for operator injury during apparatus operation. This patent also fails to address the opportunity for fluxless soldering, an important feature available in the present invention.

None of the known methods provides a method and apparatus which does not include expensive ovens of or the production of large amounts of flux residues which need to be cleaned from the printed circuit board. It is believed that such a method and apparatus would constitute an advancement in the art.

DISCLOSURE OF THE INVENTION

In accordance with one aspect the present invention, there is provided an apparatus for soldering pin-in-hole electronic circuit components on a printed circuit board comprising a die having a matrix of holes corresponding to a matrix of vias in a printed circuit board in which leads of an electronic component are to be soldered, and means for directing hot gas through the matrix of holes when a circuit board is mounted on the die such that the holes and vias are in alignment to thereby reflow solder in the vias of the printed circuit board.

An advantage of this arrangement is that it provides localized heating only to the solder joint so that the board is not burned and other circuit components are not unintentionally reflowed.

Preferably, the hot gas is nitrogen or forming gas. An advantage of using nitrogen is that it prevents oxidation and an advantage of using forming gas is that it can remove oxide. Both gases may be used in the present invention.

In accordance with another aspect of the present invention, there is provided a method for replacing a pin-in-hole electronic circuit component on a printed circuit board comprising the steps of aligning leads of the component to be replaced with holes in a die hole matrix, providing a supply of hot gas through the matrix of holes towards the component, removing the component when solder connecting it to the board has melted, inserting a replacement component to the site vacated by the removed component, and preventing the supply of hot gas from contacting the replacement component.

BRIEF DESCRIPTION OF THE DRAWINGS

In order that the invention may be fully understood, preferred embodiments thereof will now be described, by way of example only, with reference to the accompanying drawings in which.

BEST MODE FOR CARRYING OUT THE INVENTION

For better understanding of the present invention, together with other and further objects, advantages and capabilities thereof, reference is made to the following disclosure and appended claims in connection with the above-described drawings.

Figure 1:
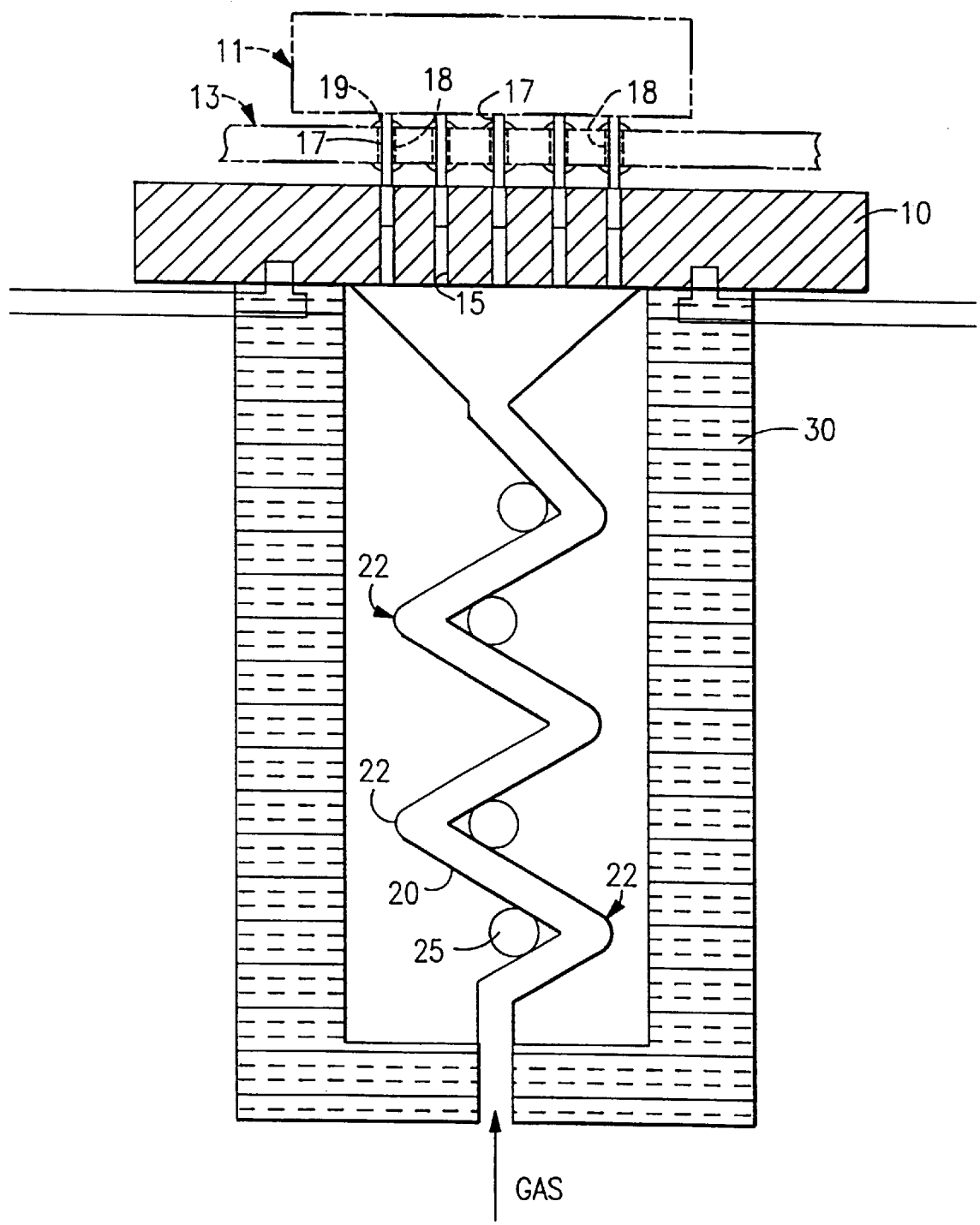
FIG. 1 shows a schematic diagram of a soldering tool in accordance with one embodiment of the present invention.

With reference to FIG. 1, a preferred embodiment of the method and apparatus of the present invention will now be described. The invention is concerned with repair processes for multiple leaded pin-in-hole (PIH) components and connectors in which leaded (pinned) components are connected to plated holes in printed circuit boards by means of solder. However the invention may also be used when first populating a printed circuit board with components.

A die hole matrix or tool plate is shown at 10 in FIG. 1. The printed circuit board (PCB) to be reworked (or repaired) is mounted on top of this plate so that vias 15 in plate 10 are aligned with the lead pattern of the component to be repaired. This component (11) is shown in phantom in FIG. 1 as mounted on the PCB (13, also in phantom). Leads (pins) 17 are seen projecting from the PIH component 11 and are held in place in holes 18 in PCB 13 using solder 19. PIH components having pins soldered into corresponding PCB holes are well known in the art. Several of these matrix or tool plates may be required to satisfy the range of pin (lead) spacing patterns of components typically used in electronic card or printed circuit and electronic card assembly. The tool plate may be aluminum or a ceramics material, the preferred material being titanium. Hot gas is supplied to the vias 15 in the plate by means of a staggered (zig-zag-shaped) pipe 20 having a plurality of elbows 22 therein. The gas in pipe 20 is heated to the required temperature for melting the solder on the circuit board by one or more heaters 25 spacedly positioned along the staggered pipe 20 (particularly, at the pipe elbows as shown in the drawings). Preferably, the gas is heated to well above soldering temperature i.e., preferably 250–300 degrees Celsius (C.). The gas pipe is enclosed within a housing (shroud) of thermal insulation 30 to preserve heat in the system and to serve as protection for the tool operator.

In the embodiment shown in FIG. 1, the gas is preferably an inert gas such as nitrogen. The nitrogen gas provides an inert atmosphere about the solder joints which does not char the organic material of the printed circuit board 13, and which prevents oxidation while enabling use of a no-clean flux. The result is that large PIH components can be removed without recourse to high solids fluxes. Thus, the hot gas can be used as the heating medium and also assist in the wetting process.

Figure 2:
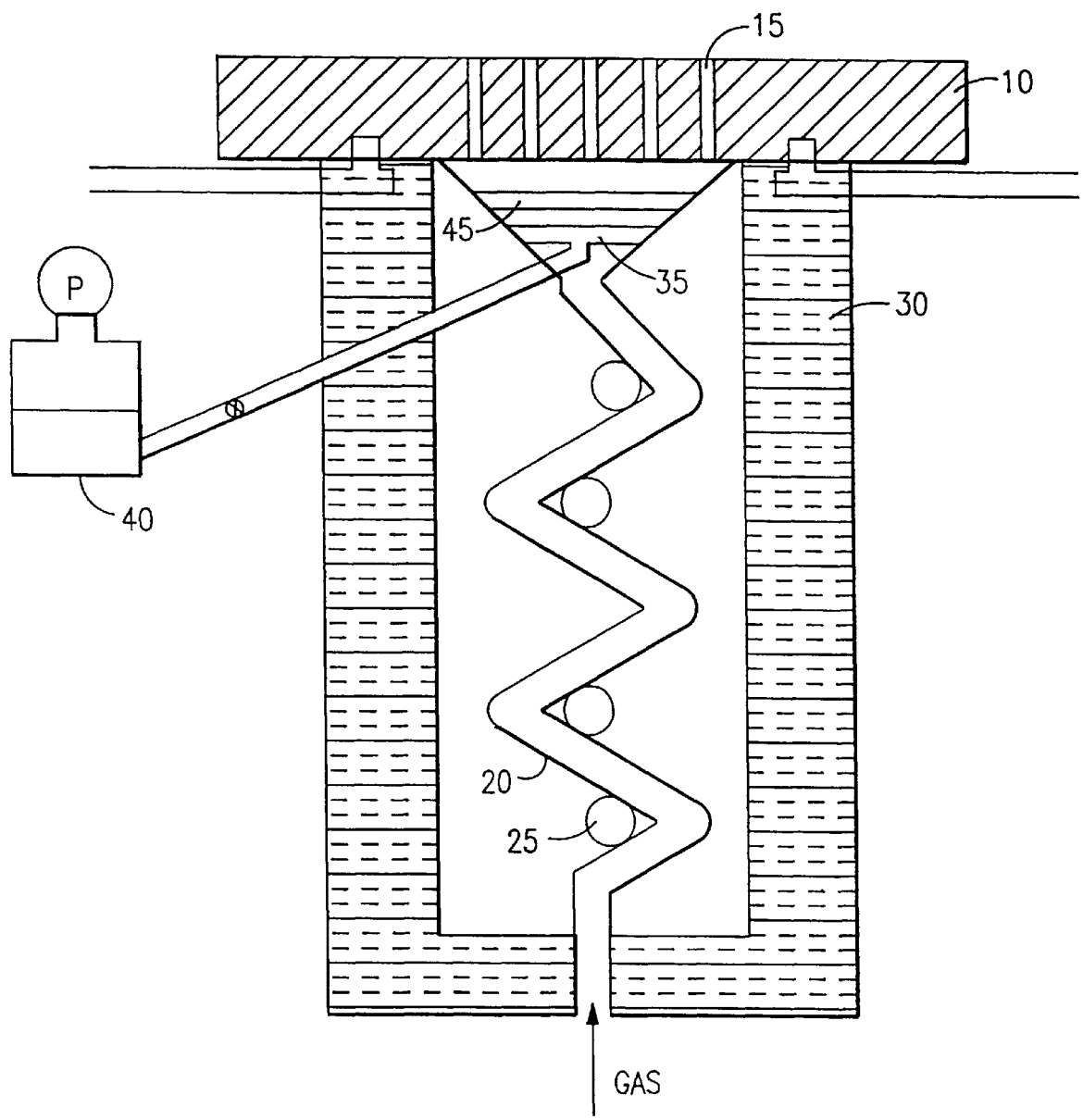
FIG. 2 shows a schematic diagram of the soldering tool in accordance with another embodiment of the present invention.

In accordance with another embodiment of the present invention, the soldering tool shown in FIG. 2 is used. This embodiment has the additional feature of a flux vaporizer 35 which comprises a plate heated by the hot gas. When the valve on the pressurized flux sump 40 is opened, the liquid flux will be ejected onto the hot plate vaporizer where vaporization will take place. A suitable no clean flux for use in this embodiment is acetic acid. A distributer member 45 may be necessary to assure that gas flow through the die matrix is uniform. A free windmilling fan (not shown) could be used for this purpose Yet another alternative to using flux in this tool is to introduce a dilute mixture of forming gas to the gas in pipe 20. This reducing atmosphere facilitates better wetting. (Forming gas is preferably about 98% nitrogen and 2% hydrogen). In this instance, the gas can act as a flux.

Optional accessories to the soldering tool described are a vision system (not shown) to aid alignment of the repair site with the die hole matrix and a mounting plate, movable in any direction in a plane for holding and positioning the substrate of a PCB relative to the die holes matrix. Such alignment systems are known and further description is not believed necessary.

The process for replacing a component in accordance with the present invention will now be described. First of all the vias 15 of the die hole matrix (tool plate) 10 are aligned, respectively, with the leads 17 of the component 11 to be repaired. The heaters and gas supply are then switched on. The matrix is brought into close proximity with the circuit board 13 to maximize local heating and prevent accidentally reflowing the solder of adjacent components. When the solder (19) has melted, the component is then removed from its site for replacement. With the gas supply still on, the replacement component is positioned on the site. If it is found that wetting is inadequate, some flux may be pulsed into the gas flow. However, it has been found that solder does not tend to separate from the board and come away on the leads of the component, instead remaining within the vias 15. No extra solder should therefore be required to produce a joint. Finally, the gas supply and heating elements are disabled (turned off) to allow the solder to solidify. Solidification can take place at room temperature or, alternatively, the gas flow can be cooled (rather than turned off), to accelerate the process.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of heating solder located in a pattern of holes in a circuit board further including a pinned electronic component positioned thereon such that the pins of said component are positioned within respective ones of said holes in said circuit board, said method comprising:

passing a quantity of gas through a pipe member located within a housing while simultaneously heating said gas within said housing using a heating means located substantially within said housing adjacent said pipe member; and directing said gas through a pattern of vias in a plate member located on said housing which align with respective ones of said holes in said circuit board so as to reflow the solder in said holes and thereby permit removal of said pins from said circuit board.

2. The method of claim 1 further comprising the step of pulsing flux into the heated gas to aid wetting of solder.

* * * * *